US 11,694,587 B2

(12) United States Patent
Zhang et al.

(10) Patent No.: US 11,694,587 B2
(45) Date of Patent: Jul. 4, 2023

(54) DEMULTIPLEXER GATE DRIVER CIRCUIT AND DISPLAY PANEL

(71) Applicant: WUHAN CHINA STAR OPTOELECTRONICS TECHNOLOGY CO., LTD., Wuhan (CN)

(72) Inventors: Dian Zhang, Wuhan (CN); Ronglei Dai, Wuhan (CN)

(73) Assignee: WUHAN CHINA STAR OPTOELECTRONICS TECHNOLOGY CO., LTD., WUHAN (CN)

(*) Notice: Subject to any disclaimer, the term of this patent is extended or adjusted under 35 U.S.C. 154(b) by 340 days.

(21) Appl. No.: 17/057,676

(22) PCT Filed: Sep. 25, 2020

(86) PCT No.: PCT/CN2020/117627
§ 371 (c)(1),
(2) Date: Nov. 22, 2020

(87) PCT Pub. No.: WO2022/052177
PCT Pub. Date: Mar. 17, 2022

(65) Prior Publication Data
US 2022/0301474 A1    Sep. 22, 2022

(30) Foreign Application Priority Data

Sep. 9, 2020 (CN) .......................... 202010938708.7

(51) Int. Cl.
G09G 3/20 (2006.01)
(52) U.S. Cl.
CPC ....... *G09G 3/20* (2013.01); *G09G 2300/0408* (2013.01); *G09G 2300/0804* (2013.01);
(Continued)

(58) Field of Classification Search
CPC ............... G09G 3/3266; G09G 3/3674; G09G 2230/00; G09G 2310/0289;
(Continued)

(56) References Cited

U.S. PATENT DOCUMENTS 9,898,989 B2 * 2/2018 Xiao .................... G06F 3/04164
11,056,064 B2 * 7/2021 Cherng ................ G09G 3/3291
2016/0189683 A1 * 6/2016 Chen ........................ G09G 5/18
345/99

FOREIGN PATENT DOCUMENTS

CN    105206244 A    12/2015
CN    105261343 A    1/2016
(Continued)

*Primary Examiner* — Priyank J Shah
(74) *Attorney, Agent, or Firm* — The Roy Gross Law Firm, LLC; Roy Gross

(57) ABSTRACT

A demultiplexer gate driver circuit and a display panel are provided. The demultiplexer gate driver circuit aims at the problem that the output amplitude of the m sub-gate drive signals divided from the gate drive signal by the demultiplexer module is low, which results in a poorer All Gate On function, when the GOA circuit of the demultiplexer module is used to achieve the All Gate On function. The full-on control module is improved by connecting the full-on control module to the m sub-gate drive signals divided from the gate drive signal. The m sub-gate drive signals are directly controlled by the full-on control module to output the high potential at the same time, and there is only one threshold voltage consumption from the full-on control signal to the sub-gate drive signals. The effect of the All Gate On function is effectively improved.

16 Claims, 3 Drawing Sheets

(52) U.S. Cl.
CPC ............. *G09G 2300/0809* (2013.01); *G09G 2310/0267* (2013.01); *G09G 2310/0297* (2013.01); *G09G 2310/08* (2013.01); *G09G 2320/0257* (2013.01)

(58) Field of Classification Search
CPC ... G09G 2300/0804; G09G 2310/0267; G09G 2310/0297; G09G 2320/0257; G09G 2310/0286; H04J 14/08; H01L 27/3276; H01L 27/3262; H04N 21/4341; H04N 21/4342
See application file for complete search history.

(56) References Cited

FOREIGN PATENT DOCUMENTS

| | | | |
|---|---|---|---|
| CN | 110322825 | A | 10/2019 |
| CN | 110322854 | A | 10/2019 |
| CN | 110782855 | A | 2/2020 |
| CN | 111048051 | A | 4/2020 |
| KR | 20190075640 | A | 7/2019 |

\* cited by examiner

DEMULTIPLEXER GATE DRIVER CIRCUIT AND DISPLAY PANEL

CROSS REFERENCE TO RELATED APPLICATIONS

This application is a National Phase Entry of PCT/CN2020/117627 filed on Sep. 25, 2020 claiming priority to Chinese application 202010938708.7 filed Sep. 9, 2020. The contents of these applications are incorporated by reference in their entirety.

FIELD OF THE INVENTION

The present disclosure relates to the field of display technology, more particularly, to a demultiplexer gate driver circuit and a display panel.

BACKGROUND

The gate driver on array (GOA) technology integrates the gate driver circuits of the display panel onto the glass substrate to form scan driving for the display panel. The GOA technology can reduce the bonding process of external ICs, reduce product costs, and is suitable for manufacturing narrow bezel display products.

A demultiplexer (DEMUX) circuit can decompose one signal into m signal channels, thus reducing output channels in multiples. Applying the demultiplexer circuit to the gate driver circuits are called mux on gate (MOG) technology, which can further realize the narrow bezel of the display panel. Therefore, the MOG technology can be applied to the GOA circuit, that is, the clock signals are formed by dividing the gate drive signal G(n) output from the GOA unit of each stage into m sub-gate drive signals through using the demultiplexer circuit, so as to drive pixels of multiple columns. The effective charging time of a single pixel remains unchanged.

In addition, when the GOA circuit wakes up from the black screen of the display panel, it is usually necessary to turn on the output terminals of the GOA units of all stages within a period of time, so that all the gate drive signals output a high potential at the same time. As a result, the thin film transistors of all the pixels in the display panel are turned on, and a black voltage is applied to all the pixels through the data signals to clear the residual charges in the display panel so as to achieve the All Gate On function to prevent the after image phenomenon of the display panel.

When the MOG circuit in the related art realizes the All Gate On function, the amplitude of m sub-gate drive signals formed by dividing the gate drive signal G(n) output from the GOA unit of each stage through using the demultiplexer circuit is low, thus resulting in insufficient turning on of the thin film transistors of the pixels in the display panel. The residual charge release effect of the display panel is poorer, and it is easy to cause the afterimage phenomenon of the display panel when it wakes up from a black screen.

SUMMARY

In order to improve the problem that the output amplitude of the m sub-gate drive signals of each stage of GOA unit is low when the MOG circuit of the related art performs the All Gate On function, and further prevent the afterimage phenomenon of the display panel when it wakes up from a black screen, the present disclosure provides a demultiplexer gate driver circuit. The demultiplexer gate driver circuit comprises n-cascaded GOA units. n is an integer greater than 1. Each cascade of the GOA units comprises a pull-up module, a demultiplexer module, and a full-on control module. Control terminals of the demultiplexer module are connected to an output terminal of the pull-up module, input terminals of the demultiplexer module are connected to demultiplexer signals, output terminals of the demultiplexer module are connected to output terminals of the full-on control module. Control terminals of the full-on control module are connected to input terminals of the full-on control module, and are connected to a full-on control signal.

The demultiplexer module is configured to divide a gate drive signal of a current stage output from the pull-up module into m sub-gate drive signals, m is an integer greater than 1. The full-on control module is configured to make a potential of the m sub-gate drive signals be a potential of the full-on control signal at the same time under a control of the full-on control signal.

In some embodiments, a control terminal of the pull-up module is connected to a first node, an input terminal is connected to an nth clock signal.

the demultiplexer gate driver circuit further comprises a pull-up control module, a pull-down control module, and a pull-down module; a control terminal of the pull-up control module is connected to a gate drive signal output from a previous stage GOA unit, and an output terminal is connected to the first node; a control terminal of the pull-down control module is connected to an n+1th clock signal, an output terminal is connected to a second node; control terminals of the pull-down module are connected to the second node, input terminals are connected to a negative power supply voltage, and output terminals are connected to the first node and the output terminals of the pull-up module and the demultiplexer module.

In some embodiments, the demultiplexer module comprises m first thin film transistors, the demultiplexer signals comprise m multiplex sub-signals, a gate of each of the first transistors is connected to the output terminal of the pull-up module, sources of the first transistors are respectively connected to the multiplex sub-signals correspondingly.

In some embodiments, the full-on control module comprises m second thin film transistors, a gate and a source of each of the second thin film transistors are connected and are connected to the full-on control signal, and drains of the second thin film transistors are connected to drains of the first thin film transistors correspondingly; the m second thin film transistors make the potential of the m sub-gate drive signals be the potential of the full-on control signal at the same time under the control of the full-on control signal.

In some embodiments, the pull-up module comprises a third thin film transistor, a gate of the third thin film transistor is connected to the first node, a source is connected to the nth clock signal, and a drain is connected to the gates of the m first thin film transistors.

In some embodiments, the pull-down module comprises a fourth thin film transistor, a fifth thin film transistor, and m sixth thin film transistors; gates of the fourth thin film transistor, the fifth thin film transistor, and the m sixth thin film transistors are all connected to the second node, and sources of them are all connected to a constant voltage low potential; a drain of the fourth thin film transistor is connected to the first node, a drain of the fifth thin film transistor is connected to the drain of the third thin film transistor, drains of the sixth thin film transistors are connected to the drains of the first thin film transistors correspondingly.

In some embodiments, the pull-down control module comprises a seventh thin film transistor, a gate of the seventh thin film transistor is connected to the n+1th clock signal, and the drain is connected to the second node.

In some embodiments, the pull-up control module comprises an eighth thin film transistor, a gate of the eighth thin film transistor is connected to an output terminal of an n−1th GOA unit, and a drain is connected to the first node.

In some embodiments, the first thin film transistors, the second thin film transistors, the third thin film transistor, the fourth thin film transistor, the fifth thin film transistor, the sixth thin film transistors, the seventh thin film transistor, and the eighth thin film transistor are all N-type thin film transistors.

The present disclosure further provides a display panel. The display panel comprises a demultiplexer gate driver circuit. The demultiplexer gate driver circuit comprises n-cascaded GOA units. n is an integer greater than 1. Each cascade of the GOA units comprises a pull-up module, a demultiplexer module, and a full-on control module. Control terminals of the demultiplexer module are connected to an output terminal of the pull-up module, input terminals of the demultiplexer module are connected to demultiplexer signals, output terminals of the demultiplexer module are connected to output terminals of the full-on control module. Control terminals of the full-on control module are connected to input terminals of the full-on control module, and are connected to a full-on control signal.

The demultiplexer module is configured to divide a gate drive signal of a current stage output from the pull-up module into m sub-gate drive signals, m is an integer greater than 1. The full-on control module is configured to make a potential of the m sub-gate drive signals be a potential of the full-on control signal at the same time under a control of the full-on control signal.

In some embodiments, a control terminal of the pull-up module is connected to a first node, an input terminal is connected to an nth clock signal.

the demultiplexer gate driver circuit further comprises a pull-up control module, a pull-down control module, and a pull-down module; a control terminal of the pull-up control module is connected to a gate drive signal output from a previous stage GOA unit, and an output terminal is connected to the first node; a control terminal of the pull-down control module is connected to an n+1th clock signal, an output terminal is connected to a second node; control terminals of the pull-down module are connected to the second node, input terminals are connected to a negative power supply voltage, and output terminals are connected to the first node and the output terminals of the pull-up module and the demultiplexer module.

In some embodiments, the demultiplexer module comprises m first thin film transistors, the demultiplexer signals comprise m multiplex sub-signals, a gate of each of the first transistors is connected to the output terminal of the pull-up module, sources of the first transistors are respectively connected to the multiplex sub-signals correspondingly.

In some embodiments, the full-on control module comprises m second thin film transistors, a gate and a source of each of the second thin film transistors are connected and are connected to the full-on control signal, and drains of the second thin film transistors are connected to drains of the first thin film transistors correspondingly; the m second thin film transistors make the potential of the m sub-gate drive signals be the potential of the full-on control signal at the same time under the control of the full-on control signal.

In some embodiments, the pull-up module comprises a third thin film transistor, a gate of the third thin film transistor is connected to the first node, a source is connected to the nth clock signal, and a drain is connected to the gates of the m first thin film transistors.

In some embodiments, the pull-down module comprises a fourth thin film transistor, a fifth thin film transistor, and m sixth thin film transistors; gates of the fourth thin film transistor, the fifth thin film transistor, and the m sixth thin film transistors are all connected to the second node, and sources of them are all connected to a constant voltage low potential; a drain of the fourth thin film transistor is connected to the first node, a drain of the fifth thin film transistor is connected to the drain of the third thin film transistor, drains of the sixth thin film transistors are connected to the drains of the first thin film transistors correspondingly.

In some embodiments, the pull-down control module comprises a seventh thin film transistor, a gate of the seventh thin film transistor is connected to the n+1th clock signal, and the drain is connected to the second node.

In some embodiments, the pull-up control module comprises an eighth thin film transistor, a gate of the eighth thin film transistor is connected to an output terminal of an n−1th GOA unit, and a drain is connected to the first node.

In some embodiments, the first thin film transistors, the second thin film transistors, the third thin film transistor, the fourth thin film transistor, the fifth thin film transistor, the sixth thin film transistors, the seventh thin film transistor, and the eighth thin film transistor are all N-type thin film transistors.

In the demultiplexer gate driver circuit and display panel according to the present disclosure, the demultiplexer gate driver circuit aims at the problem that the output amplitude of the m sub-gate drive signals divided from the gate drive signal G(n) by the demultiplexer module is low, which results in a poorer All Gate On function, when the GOA circuit of the demultiplexer module is used to achieve the All Gate On function. The full-on control module is improved by connecting the full-on control module to the m sub-gate drive signals divided from the gate drive signal G(n). In this manner, the m sub-gate drive signals are directly controlled by the full-on control module to output the high potential at the same time, and there is only one threshold voltage consumption from the full-on control signal to the sub-gate drive signals. As compared with the related art in which the two threshold voltages are consumed, one threshold voltage consumption is reduced to increase the potential that the full-on control signal ultimately acts on each of the sub-gate drive signals. The effect of the All Gate On function is effectively improved, which is helpful in preventing the afterimage phenomenon of the display panel when it wakes up from a black screen.

DESCRIPTION OF THE EMBODIMENTS

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

All of the embodiments of the present disclosure distinguish the two electrodes of the thin film transistor except the gate, and one of them is called a source and another one is called a drain. Since the source and the drain of the thin film transistor are symmetrical, the source and drain are interchangeable. Based on the configuration in the figure, it is defined that a middle terminal of the thin film transistor is the gate, a signal input terminal is the source, and a signal output terminal is the drain. In addition, the thin film transistors used in all embodiments of the present disclosure may comprise P-type and/or N-type transistors. The P-type thin film transistor is turned on when the gate is at a low potential, and turned off when the gate is at a high potential; the N-type thin film transistor is turned on when the gate is at the high potential, and turned off when the gate is at the low potential.

Figure 1:
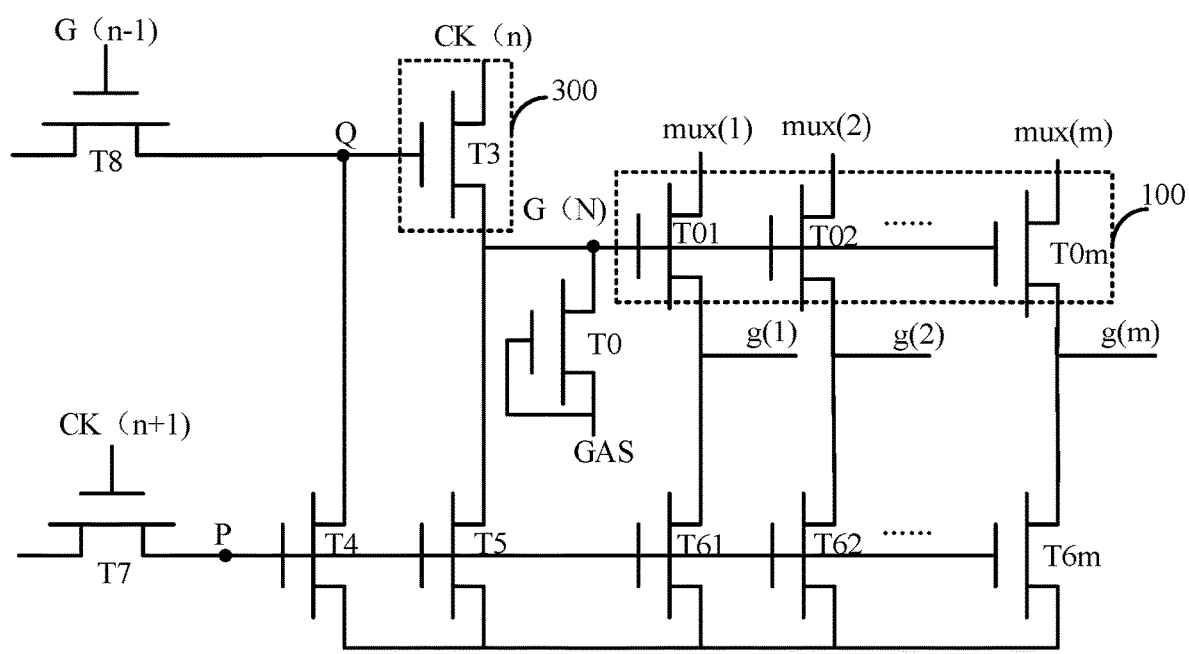
FIG. 1 is a circuit diagram of an MOG circuit in the related art.

FIG. 1 is a circuit diagram of an MOG circuit in the related art. Thin film transistors in this circuit are all N-type thin film transistors. As shown in FIG. 1, the MOG circuit in the related art usually connects a gate drive signal G(n) of a current stage output by a thin film transistor T3 of a pull-up module 300 in each stage of GOA unit to gates of m thin film transistors T01~T0m in a demultiplexer module 100, and m is an integer greater than 1. In the MOG circuit of the related art, a gate and a drain of a thin film transistor TO are connected, and a source of the thin film transistor TO is connected to an output terminal G(n) of the thin film transistor T3. When the MOG circuit performs the All Gate On function, an effective potential of a full-on control signal GAS is set at a high potential. By setting the GAS signal at the high potential, the gate drive signal G(n) of the current stage is pulled high to turn on all the m thin film transistors in the demultiplexer module 100. At the same time, through setting mux(1)~mux(m) connected to the T01~T0m at the high potential, gate drive signals g(1)~g(m) output through the m thin film transistors in the demultiplexer module 100 all output the high potential simultaneously, so as to achieve the All Gate On function.

According to the principle that Vgs=Vth when a thin film transistor is turned off, where Vgs is a voltage difference between a source and a gate of the thin film transistor and Vth is a threshold voltage of the thin film transistor, it can be understood that the GAS signal to the output terminal G(n) is consumed by a threshold voltage of the thin film transistor TO, and then from the output terminal G(n) to g(1)~g(m) signals is consumed by a threshold voltage of each of the m thin film transistors in the demultiplexer module 100 when the MOG circuit of the related art realizes the All Gate On function. That is, the GAS signal is consumed by the two threshold voltages to become the g(1)~g(m) signals. This will cause an output amplitude of the g(1)~g(m) signals to be low, which results in a poorer residual charge release effect of the display panel. It is thus easy to cause an afterimage phenomenon of the display panel in the black screen wake-up stage, and a bad appearance occurs.

Figure 2:
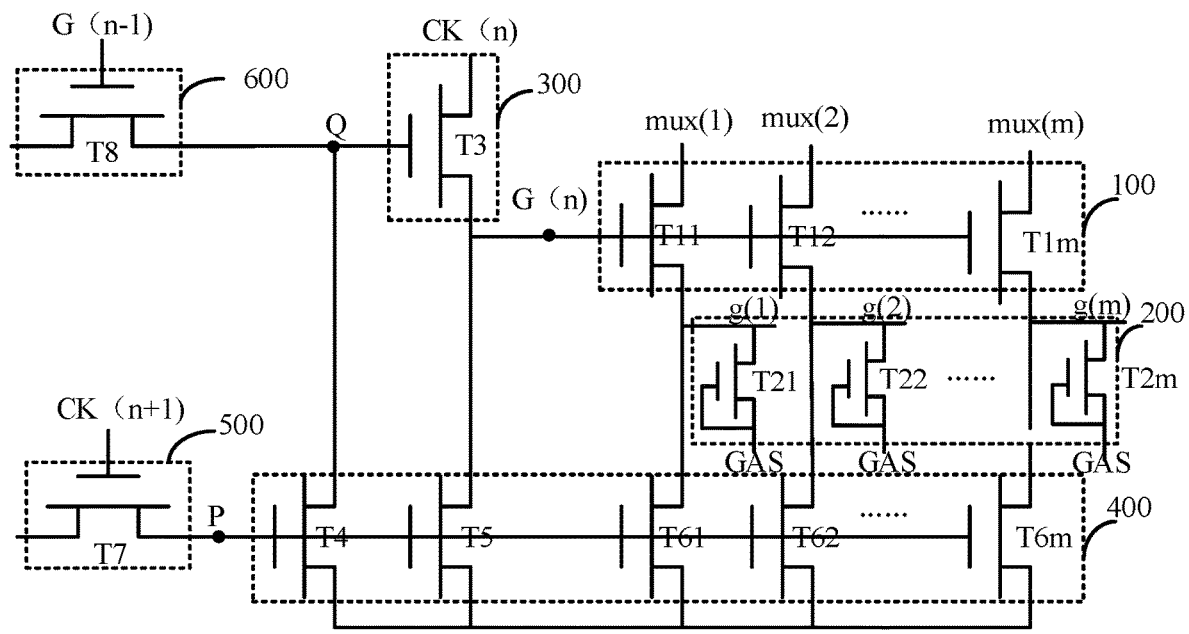
FIG. 2 is a circuit diagram of a demultiplexer gate driver circuit according to one embodiment of the disclosure.

In view of the above problem, one embodiment of the present disclosure provides a demultiplexer gate driver circuit. FIG. 2 is a circuit diagram of a demultiplexer gate driver circuit according to one embodiment of the present disclosure. As shown in FIG. 2, the demultiplexer gate driver circuit comprises n-cascaded GOA units, where n is an integer greater than 1. Each cascade of the GOA units comprises the pull-up module 300, the demultiplexer module 100, and a full-on control module 200.

Control terminals of the demultiplexer module 100 are connected to an output terminal of the pull-up module 300. Input terminals of the demultiplexer module 100 are connected to demultiplexer signals mux (not shown in the figure). Output terminals of the demultiplexer module 100 are connected to output terminals of the full-on control module 200. The demultiplexer module 100 is configured to divide a gate drive signal G(n) output from the pull-up module 300 into m sub-gate drive signals g(1)-g(m), where m is an integer greater than 1.

Control terminals of the full-on control module 200 are connected to its input terminals, and are connected to a full-on control signal GAS. The full-on control module 200 is configured to make the m sub-gate drive signals g(1)-g(m) output a potential of the full-on control signal GAS at the same time under a control of the full-on control signal GAS. In the present embodiment and the following embodiments of the present disclosure, effective potentials of the full-on control signals GAS are all set at a high potential.

When the All Gate On function is performed, the full-on control signal GAS is set at the high potential, so that the m sub-gate drive signals g(1)-g(m) output the high potential at the same time. As a result, m columns of pixels controlled by the m sub-gate drive signals g(1)-g(m) are turned on at the same time.

The demultiplexer gate driver circuit according to the embodiment of the present disclosure aims at the problem that the output amplitude of the sub-gate drive signals is low, which results in a poorer All Gate On function, when the demultiplexer module is used to divide the gate drive signal G(n) output from the GOA unit of each stage into the m sub-gate drive signals g(1)-g(m) to achieve the All Gate On function. The full-on control module is improved by changing the connection between the full-on control module and the gate drive signal G(n) in the related art to the connection between the full-on control module and the m sub-gate drive signals g(1)-g(m) divided from the gate drive signal G(n). In this manner, the m sub-gate drive signals g(1)~g(m) are directly controlled by the full-on control module to output the high potential at the same time, and there is only one threshold voltage consumption from the full-on control signal GAS to the sub-gate drive signals. As compared with the related art in which the two threshold voltages are consumed, one threshold voltage consumption is reduced to increase the potential that the full-on control signal GAS ultimately acts on each of the sub-gate drive signals g(1)-g(m). The effect of the All Gate On function is effectively improved, which is helpful in preventing the afterimage phenomenon of the display panel when it wakes up from a black screen.

As shown in FIG. 2, a control terminal of the pull-up module 300 is connected to a first node Q, and an input terminal is connected to an nth clock signal CK(n). In greater detail, the demultiplexer gate driver circuit further comprises a pull-up control module 600, a pull-down control module 500, and a pull-down module 400.

A control terminal of the pull-up control module 600 is connected to a gate drive signal G(n−1) output from a previous stage GOA unit, and an output terminal is connected to the first node Q.

A control terminal of the pull-down control module 500 is connected to an n+1th clock signal CK(n+1), an output terminal is connected to a second node P.

Control terminals of the pull-down module 400 are connected to the second node P, input terminals are connected to a negative power supply voltage VGL, and output terminals are connected to the first node Q and the output terminals of the pull-up module 300 and the demultiplexer module 100.

During a pull-up stage, due to a pull-up effect of the gate drive signal G(n−1) output from the previous stage GOA unit on the pull-up control module 600, the first node Q is pulled high and the pull-up module 300 is turned on. The pull-up module 300 outputs the gate drive signal G(n) of a current stage when the nth clock signal CK(n) becomes high. During a pull-down stage, the pull-down control module 500 turns on the pull-down module 400 under a control of the n+1th clock signal CK(n+1), so that the first node Q, the pull-up module 300, and the demultiplexer module 100 are all pulled down. The m sub-gate drive signals g(1)-g(m) stop outputting the drive signals.

The demultiplexer module 100 comprises m first thin film transistors T11, T12 . . . Tim. The demultiplexer signals comprise m multiplex sub-signals mux(1), mux(2) mux(m). A gate of each of the first transistors is connected to the output terminal of the pull-up module 300, sources of the first transistors are respectively connected to the multiplex sub-signals correspondingly. It is understandable that each of the first thin film transistors is connected to each of the multiplex sub-signals in a one-to-one manner, for example, T11 is connected to mux(1), T12 is connected to mux(2) T1m is connected to mux(m).

The full-on control module 200 comprises m second thin film transistors T21, T22 . . . T2m. A gate and a source of each of the second thin film transistors T21, T22 . . . T2m are connected and are connected to the full-on control signal GAS, and drains of the second thin film transistors T21, T22 . . . T2m are connected to drains of the first thin film transistors T11, T12 . . . T1m correspondingly. Under the control of the full-on control signal GAS, the m second thin film transistors make the m sub-gate drive signals g(1)-g(m) output the potential of the full-on control signal GAS at the same time.

The pull-up module 300 comprises a third thin film transistor T3. A gate of the third thin film transistor T3 is connected to the first node Q, a source is connected to the nth clock signal CK(n), and a drain is connected to the gates of the m first thin film transistors T11, T12 . . . T1m.

The pull-down module 400 comprises a fourth thin film transistor T4, a fifth thin film transistor T5, and m sixth thin film transistors T61, T62 . . . T6m. Gates of the fourth thin film transistor T4, the fifth thin film transistor T5, and the m sixth thin film transistors T61, T62 . . . T6m are all connected to the second node P, and sources of them are all connected to the constant voltage low potential VGL. A drain of the fourth thin film transistor T4 is connected to the first node Q. A drain of the fifth thin film transistor T5 is connected to the drain of the third thin film transistor T3. Drains of the sixth thin film transistor T61, T62 . . . T6m are connected to the drains of the first thin film transistors T11, T12 . . . T1m correspondingly.

The pull-down control module 500 comprises a seventh thin film transistor T7. A gate of the seventh thin film transistor T7 is connected to the n+1th clock signal CK(n+1), and a drain is connected to the second node P.

The pull-up control module 600 comprises an eighth thin film transistor T8. A gate of the eighth thin film transistor T8 is connected to an output terminal G(n−1) of an n−1th GOA unit, and a drain is connected to the first node Q.

In the embodiments of the present disclosure, the first thin film transistors T11, T12 . . . T1m, the second thin film transistors T21, T22 . . . T2m, the third thin film transistor T3, the fourth thin film transistor T4, the fifth thin film transistor T5, the sixth thin film transistors T61, T62 . . . T6m, the seventh thin film transistor T7, and the eighth thin film transistor T8 are all N-type thin film transistors.

When the full-on control signal GAS is not input, the m first thin film transistors T11, T12 . . . T1m output the m sub-gate drive signals g(1)-g(m) in sequence under a control of the m multiplex sub-signals mux(1), mux(2) mux(m), which are used to drive the m columns of pixels correspondingly to turn on sequentially. That is, each stage of GOA unit drives the corresponding one of the m columns of pixels to turn on sequentially.

Figure 3:
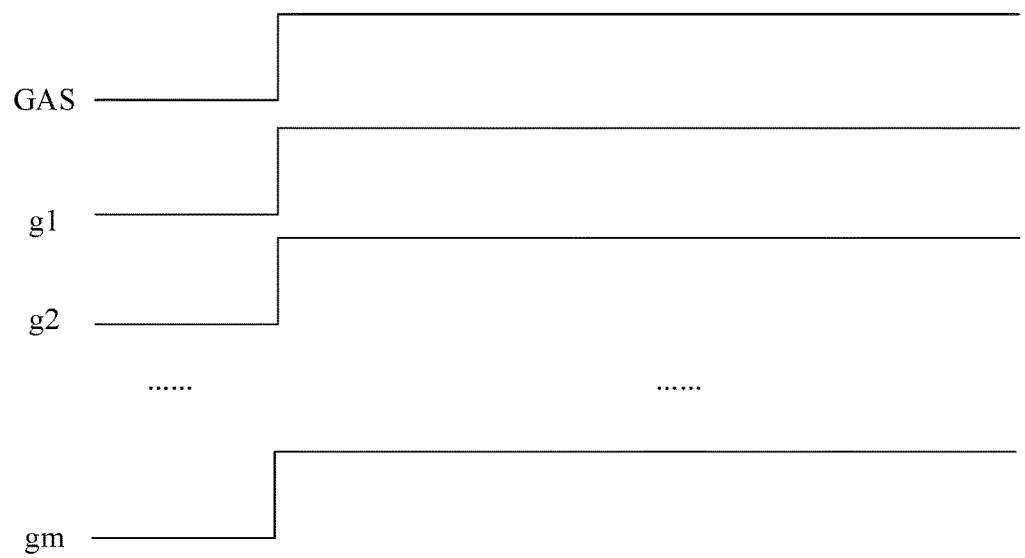
FIG. 3 is a timing diagram of a demultiplexer gate driver circuit according to one embodiment of the present disclosure.

FIG. 3 is a timing diagram of a demultiplexer gate driver circuit according to one embodiment of the present disclosure. As shown in FIG. 2 and FIG. 3, take the m second thin film transistors T21, T22 . . . T2m included in the full-on control module 200 all adopting N-type thin film transistors as an example, when the full-on control signal GAS is input at the high potential, the m sub-gate drive signals g(1)-g(m) output the high potential at the same time. The m sub-gate drive signals g(1)~g(m) control the corresponding pixels to turn on at the same time. At this time, a black voltage or an intermediate voltage is simultaneously applied to all the pixels through data signals to clear residual charges of the display panel, so as to prevent the afterimage of the display panel. Here, there is only one threshold voltage consumption from the full-on control signal GAS to each of the sub-gate drive signals. As a result, the potential that the full-on control signal GAS ultimately acts on each of the sub-gate drive signals g(1)-g(m) can be increased to effectively improve the All Gate On function, which is helpful in preventing the afterimage phenomenon of the display panel when it wakes up from a black screen.

Figure 4:
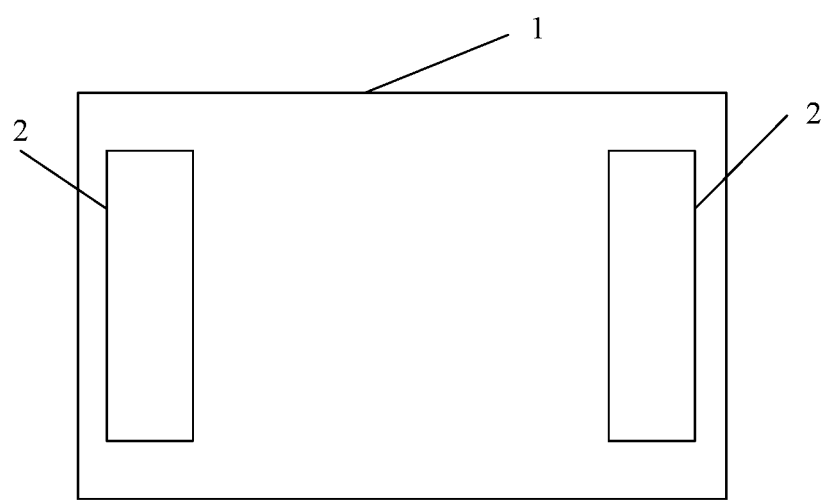
FIG. 4 is a schematic diagram a structure of a display panel according to one embodiment of the present disclosure.

FIG. 4 is a schematic diagram a structure of a display panel according to one embodiment of the present disclosure. As shown in FIG. 4, the embodiment of the present disclosure further provides a display panel 1. The display panel 1 comprises a demultiplexer gate driver circuit 2 as described above. The display panel 1 and the demultiplexer gate driver circuit 2 have the same structures and beneficial effects as mentioned above. Since the demultiplexer gate driver circuit 2 has been described in detail in the foregoing embodiments, a description in this regard is not repeated.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:
1. A demultiplexer gate driver circuit comprising n-cascaded GOA units, n being an integer greater than 1, each cascade of the GOA units comprising a pull-up module, a demultiplexer module, and a full-on control module;
control terminals of the demultiplexer module being connected to an output terminal of the pull-up module, input terminals of the demultiplexer module being connected to demultiplexer signals, output terminals of the demultiplexer module being connected to output terminals of the full-on control module;

control terminals of the full-on control module being connected to input terminals of the full-on control module, and being connected to a full-on control signal;

a control terminal of the pull-up module is connected to a first node, an input terminal is connected to an nth clock signal;

wherein the demultiplexer module is configured to divide a gate drive signal of a current stage output from the pull-up module into m sub-gate drive signals, m is an integer greater than 1;

the full-on control module is configured to make a potential of the m sub-gate drive signals be a potential of the full-on control signal at the same time under a control of the full-on control signal;

wherein the demultiplexer gate driver circuit further comprises a pull-up control module, a pull-down control module, and a pull-down module;

a control terminal of the pull-up control module is connected to a gate drive signal output from a previous stage GOA unit, and an output terminal is connected to the first node;

a control terminal of the pull-down control module is connected to an n+1th clock signal, an output terminal is connected to a second node;

control terminals of the pull-down module are connected to the second node, input terminals are connected to a negative power supply voltage, and output terminals are connected to the first node and the output terminals of the pull-up module and the demultiplexer module.

2. The demultiplexer gate driver circuit as claimed in claim 1, wherein the demultiplexer module comprises m first thin film transistors, the demultiplexer signals comprise m multiplex sub-signals, a gate of each of the first transistors is connected to the output terminal of the pull-up module, sources of the first transistors are respectively connected to the multiplex sub-signals correspondingly.

3. The demultiplexer gate driver circuit as claimed in claim 2, wherein the full-on control module comprises m second thin film transistors, a gate and a source of each of the second thin film transistors are connected and are connected to the full-on control signal, and drains of the second thin film transistors are connected to drains of the first thin film transistors correspondingly;

the m second thin film transistors make the potential of the m sub-gate drive signals be the potential of the full-on control signal at the same time under the control of the full-on control signal.

4. The demultiplexer gate driver circuit as claimed in claim 3, wherein the pull-up module comprises a third thin film transistor, a gate of the third thin film transistor is connected to the first node, a source is connected to the nth clock signal, and a drain is connected to the gates of the m first thin film transistors.

5. The demultiplexer gate driver circuit as claimed in claim 4, wherein the pull-down module comprises a fourth thin film transistor, a fifth thin film transistor, and m sixth thin film transistors;

gates of the fourth thin film transistor, the fifth thin film transistor, and the m sixth thin film transistors are all connected to the second node, and sources of them are all connected to a constant voltage low potential;

a drain of the fourth thin film transistor is connected to the first node, a drain of the fifth thin film transistor is connected to the drain of the third thin film transistor, drains of the sixth thin film transistors are connected to the drains of the first thin film transistors correspondingly.

6. The demultiplexer gate driver circuit as claimed in claim 5, wherein the pull-down control module comprises a seventh thin film transistor, a gate of the seventh thin film transistor is connected to the n+1th clock signal, and the drain is connected to the second node.

7. The demultiplexer gate driver circuit as claimed in claim 6, wherein the pull-up control module comprises an eighth thin film transistor, a gate of the eighth thin film transistor is connected to an output terminal of an n−1th GOA unit, and a drain is connected to the first node.

8. The demultiplexer gate driver circuit as claimed in claim 7, wherein the first thin film transistors, the second thin film transistors, the third thin film transistor, the fourth thin film transistor, the fifth thin film transistor, the sixth thin film transistors, the seventh thin film transistor, and the eighth thin film transistor are all N-type thin film transistors.

9. A display panel, comprising a demultiplexer gate driver that comprises n-cascaded GOA units where n is an integer greater than 1, each cascade of the GOA units comprising a pull-up module, a demultiplexer module, and a full-on control module;

control terminals of the demultiplexer module being connected to an output terminal of the pull-up module, input terminals of the demultiplexer module being connected to demultiplexer signals, output terminals of the demultiplexer module being connected to output terminals of the full-on control module;

control terminals of the full-on control module being connected to input terminals of the full-on control module, and being connected to a full-on control signal;

a control terminal of the pull-up module is connected to a first node, an input terminal is connected to an nth clock signal;

wherein the demultiplexer module is configured to divide a gate drive signal of a current stage output from the pull-up module into m sub-gate drive signals, m is an integer greater than 1;

the full-on control module is configured to make a potential of the m sub-gate drive signals be a potential of the full-on control signal at the same time under a control of the full-on control signal;

wherein the demultiplexer gate driver circuit further comprises a pull-up control module, a pull-down control module, and a pull-down module;

a control terminal of the pull-up control module is connected to a gate drive signal output from a previous stage GOA unit, and an output terminal is connected to the first node;

a control terminal of the pull-down control module is connected to an n+1th clock signal, an output terminal is connected to a second node;

control terminals of the pull-down module are connected to the second node, input terminals are connected to a negative power supply voltage, and output terminals are connected to the first node and the output terminals of the pull-up module and the demultiplexer module.

10. The display panel as claimed in claim 9, wherein the demultiplexer module comprises m first thin film transistors, the demultiplexer signals comprise m multiplex sub-signals, a gate of each of the first transistors is connected to the output terminal of the pull-up module, sources of the first transistors are respectively connected to the multiplex sub-signals correspondingly.

11. The display panel as claimed in claim 10, wherein the full-on control module comprises m second thin film transistors, a gate and a source of each of the second thin film transistors are connected and are connected to the full-on control signal, and drains of the second thin film transistors are connected to drains of the first thin film transistors correspondingly;

the m second thin film transistors make the potential of the m sub-gate drive signals be the potential of the full-on control signal at the same time under the control of the full-on control signal.

12. The display panel as claimed in claim 11, wherein the pull-up module comprises a third thin film transistor, a gate of the third thin film transistor is connected to the first node, a source is connected to the nth clock signal, and a drain is connected to the gates of the m first thin film transistors.

13. The display panel as claimed in claim 12, wherein the pull-down module comprises a fourth thin film transistor, a fifth thin film transistor, and m sixth thin film transistors;

gates of the fourth thin film transistor, the fifth thin film transistor, and the m sixth thin film transistors are all connected to the second node, and sources of them are all connected to a constant voltage low potential;

a drain of the fourth thin film transistor is connected to the first node, a drain of the fifth thin film transistor is connected to the drain of the third thin film transistor, drains of the sixth thin film transistors are connected to the drains of the first thin film transistors correspondingly.

14. The display panel as claimed in claim 13, wherein the pull-down control module comprises a seventh thin film transistor, a gate of the seventh thin film transistor is connected to the n+1th clock signal, and the drain is connected to the second node.

15. The display panel as claimed in claim 14, wherein the pull-up control module comprises an eighth thin film transistor, a gate of the eighth thin film transistor is connected to an output terminal of an n−1th GOA unit, and a drain is connected to the first node.

16. The display panel as claimed in claim 15, wherein the first thin film transistors, the second thin film transistors, the third thin film transistor, the fourth thin film transistor, the fifth thin film transistor, the sixth thin film transistors, the seventh thin film transistor, and the eighth thin film transistor are all N-type thin film transistors.

\* \* \* \* \*